United States Patent [19]

Chang et al.

[11] Patent Number: 4,982,260
[45] Date of Patent: Jan. 1, 1991

[54] POWER RECTIFIER WITH TRENCHES

[75] Inventors: Hsueh-Rong Chang, Scotia, N.Y.;
Bantval J. Baliga, Raleigh, N.C.;
David W. Tong, Scotia, N.Y.

[73] Assignee: General Electric Company, Schenectady, N.Y.

[21] Appl. No.: 415,850

[22] Filed: Oct. 2, 1989

[51] Int. Cl.[5] .................. H01L 29/74; H01L 29/48; H01L 29/80; H01L 29/12
[52] U.S. Cl. ........................... 357/38; 357/15; 357/22; 357/58
[58] Field of Search .............. 357/38, 22 K, 15, 22 D, 357/22 E, 58, 86, 55

[56] References Cited

U.S. PATENT DOCUMENTS

| | | | |
|---|---|---|---|
| 4,571,815 | 2/1986 | Baliga et al. | 29/571 |
| 4,587,712 | 5/1986 | Baliga | 29/571 |
| 4,641,174 | 2/1987 | Baliga | 357/58 |
| 4,827,321 | 5/1989 | Baliga | 357/37 |

Primary Examiner—William Mintel
Assistant Examiner—Roy Potter
Attorney, Agent, or Firm—John S. Beulick; James C. Davis, Jr.; Paul R. Webb, II

[57] ABSTRACT

A semiconductor power rectifier attains low forward voltage drop, low reverse leakage current and improved switching speed by utilizing Schottky contact regions in a p-i-n rectifier along with other means for reducing the required forward bias voltage. In a preferred embodiment, the other means for reducing the required forward bias voltage includes a respective trench between each respective pair of successively spaced current interruption means.

19 Claims, 24 Drawing Sheets

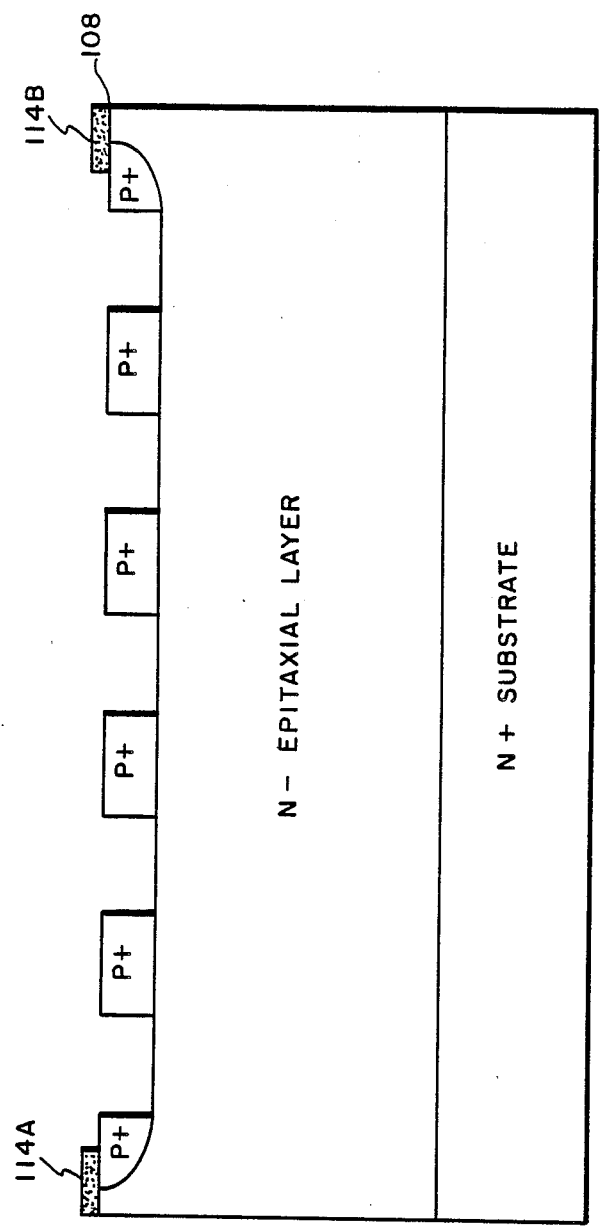

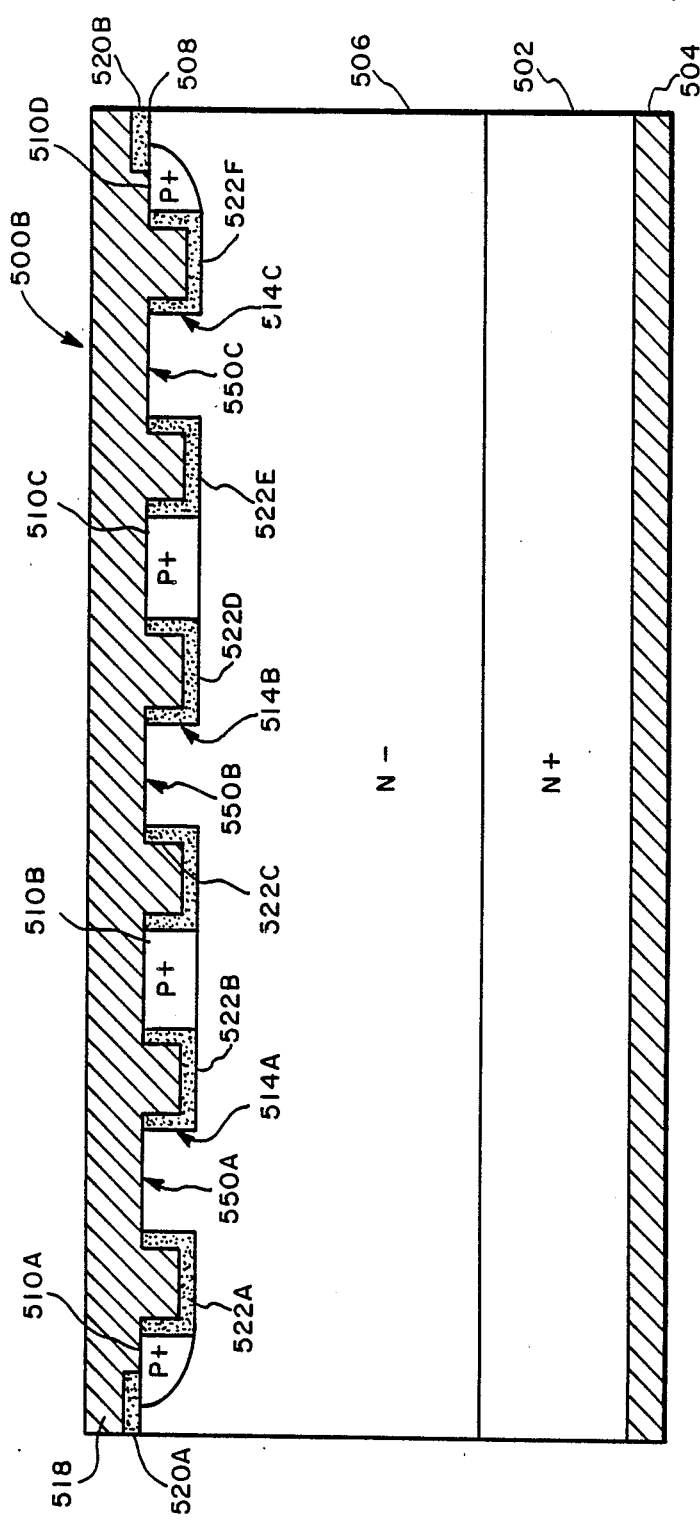

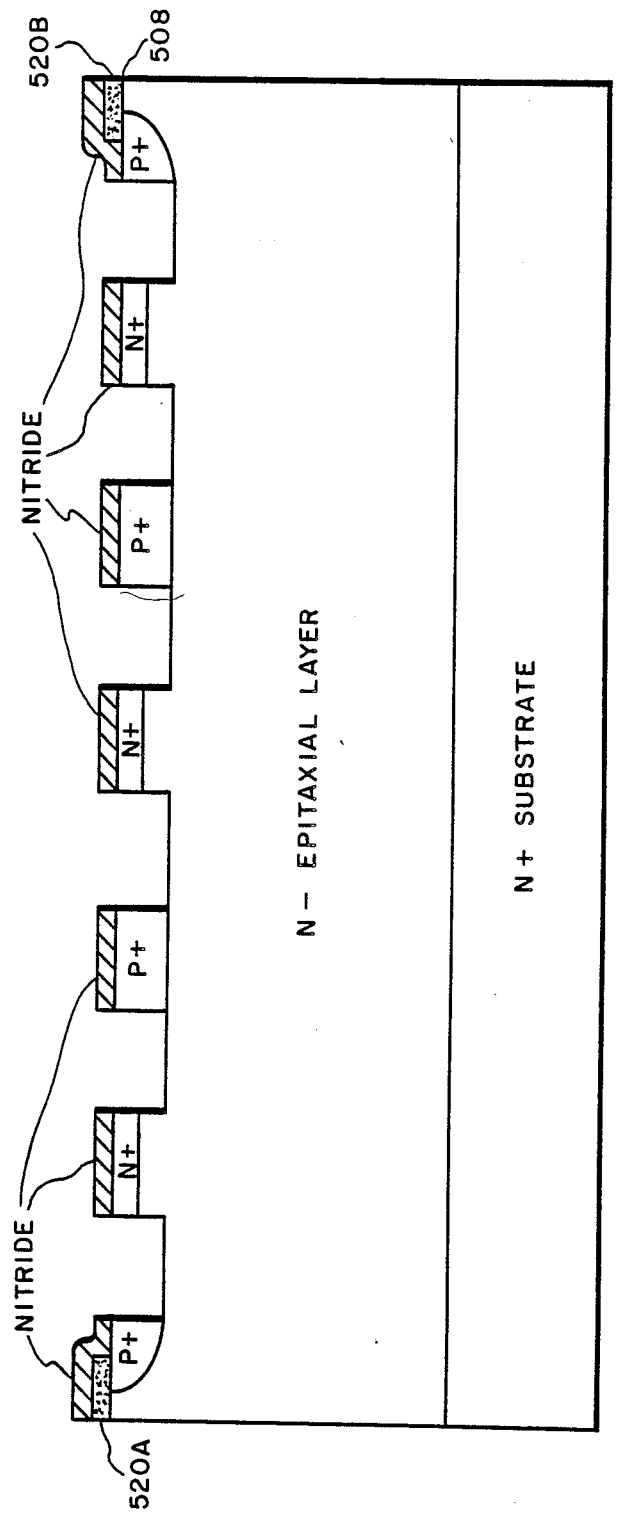

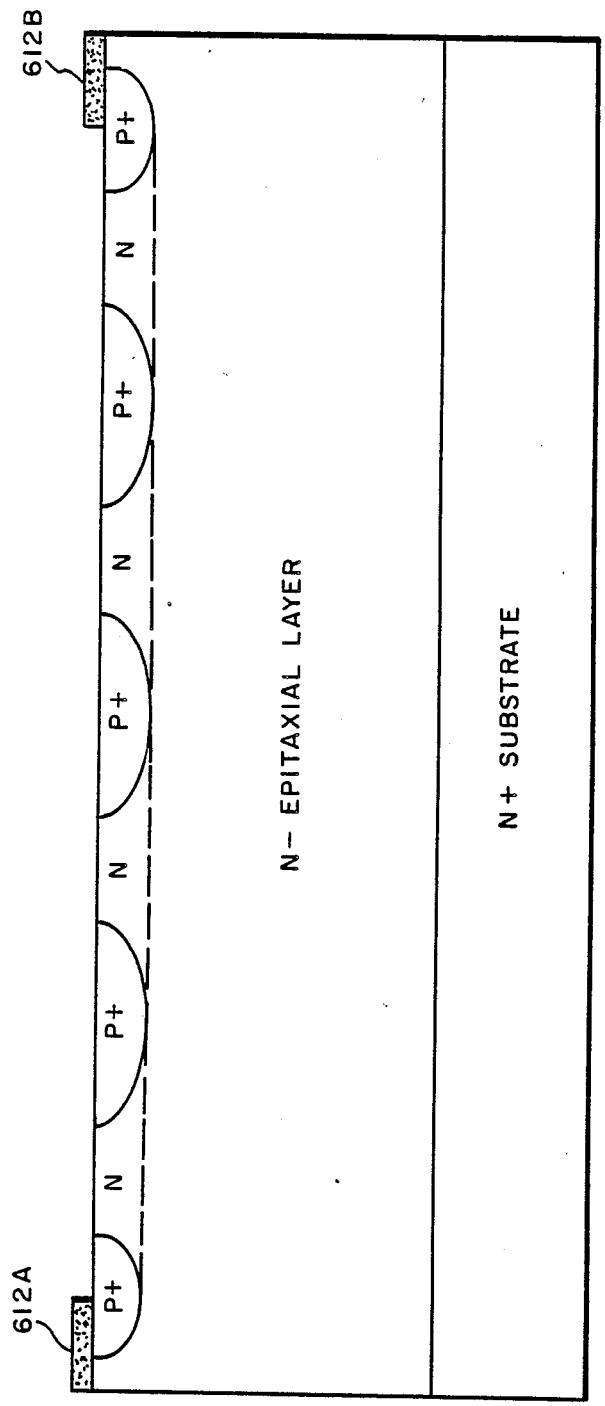

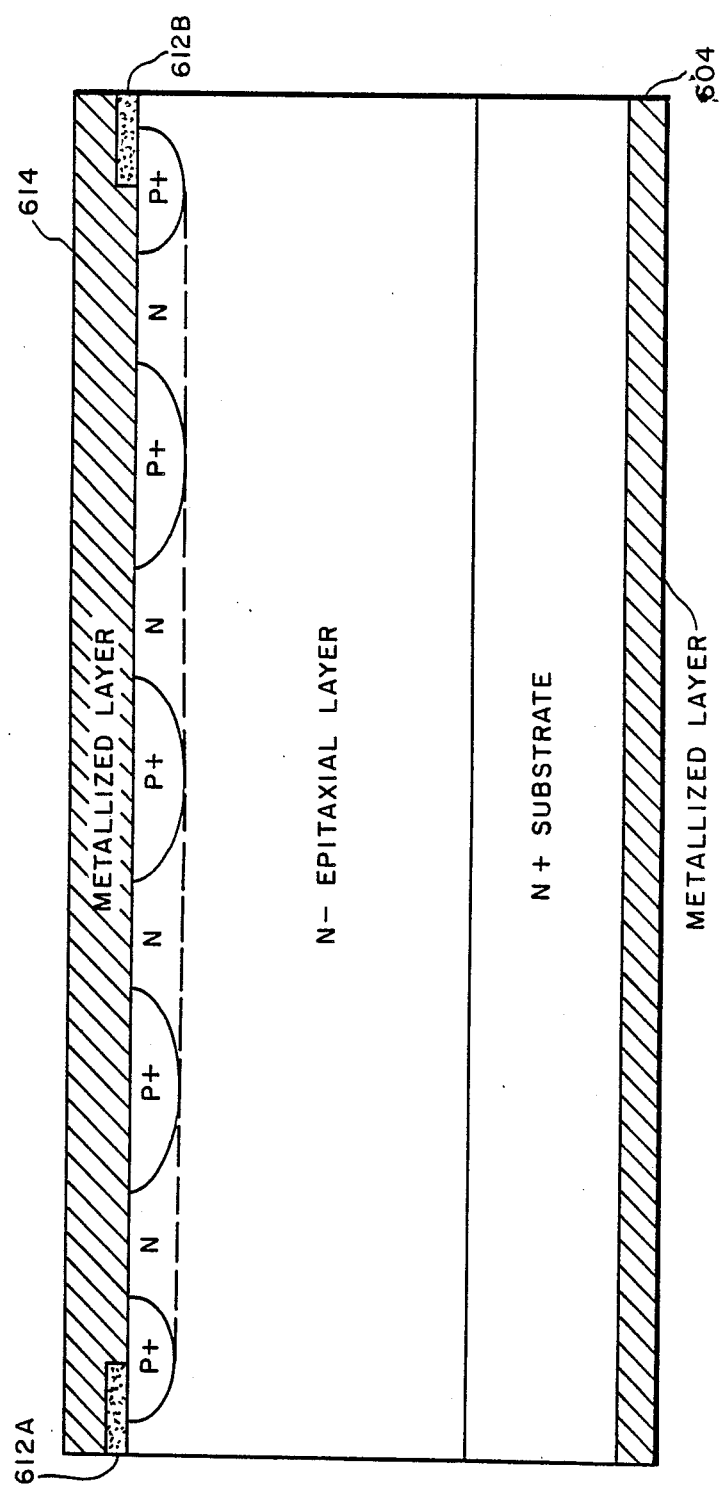

POWER RECTIFIER WITH TRENCHES

The present invention relates generally to rectifiers and more particularly to a 2-terminal semiconductor rectifier construction which may be utilized in high or low voltage operation and includes a structure for reducing the required forward-bias voltage and improving the switching speed of the rectifier.

BACKGROUND OF THE INVENTION

Rectifiers are electrical devices that are particularly adapted to rectifying current, that is converting alternating current to direct current. More specifically, rectifiers exhibit a very low resistance to current flow when forward-biased (i.e., anode biased more positive than cathode) and a very high resistance to current flow when reverse-biased (i.e., anode biased more negative than cathode).

One known form of rectifier is a semiconductor p-i-n diode, which typically comprises semiconductor layers arranged as $P^+/N/N^+$. The "$P^+$" and "$N^+$" layers constitute semiconductor regions that are highly-doped with P-conductivity type dopant and with N-conductivity type dopant, respectively. The intermediate "N" layer is relatively lightly doped with N-conductivity type dopant so that it can support high reverse voltages without current conduction.

In operation of a p-i-n diode, a forward bias to typically 0.8 to 1.0 volts (for silicon devices) is required to initiate current conduction. This forward voltage drop of 0.8 to 1.0 volts undesirably results in a high level of waste heat generation during forward conduction; a rectifier with a lower forward voltage drop would thus be desirable so as to limit waste heat generation.

A p-i-n diode is a "bipolar" device in that current flow in the diode is due to current carriers of both types, that is, both holes and electrons. Relative to unipolar device in which current flow is due to only hole or electron flow, bipolar devices are slow at turning off, since, after turn-off initiation in a bipolar device, there is a delay during which minority carriers (i.e., holes in the "N" region of a typical p-i-n diode) recombine with majority carriers. The slower turn-off speed of bipolar device make them less suitable than unipolar devices for high-speed switching applications.

A rectifier that was developed to provide a lower forward voltage drop and a faster turn-off speed than a p-i-n diode is the Schottky diode. In a typical Schottky diode, a Schottky barrier contact is formed between a first electrode and a first N-conductivity type layer of semiconductor material. The first layer has a dopant concentration per cubic centimeter below about $1 \times 10^{17}$, at least for N-conductivity type silicon. A Schottky barrier contact exhibits a potential barrier to current flow and, like a p-i-n diode, must be forward biased to initiate current flow. If the first layer had a dopant concentration in excess of the foregoing value, an ohmic contact between the first electrode and first layer would result, which does not exhibit a potential barrier to current flow. In the foregoing Schottky diode, an ohmic contact is formed between a second N-conductivity type layer of more highly doped semiconductor material adjoining the first layer and a second electrode.

Although Schottky diodes exhibit lower forward voltage drops and faster turn-off speeds than p-i-n diodes, this is at the expense of exhibiting high reverse leakage currents, which increase significantly for increasing values of reverse voltage.

A rectifier which attains a low forward voltage drop and fast turn-off speed without exhibiting a high level of reverse leakage current is described in commonly assigned U.S. Pat. No. 4,641,174, which is incorporated herein in its entirety by reference. The rectifier described in the above-identified patent generally is referred to as a pinch rectifier. In the pinch rectifier, conduction channel regions are formed in the drift region, and the forward resistance to current flow of the pinch rectifier is a function of, among other things, the length of the drift region. Specifically, as the length of the drift region is shortened, the forward resistance of the pinch rectifier decreases.

Further, in the pinch rectifier disclosed in the above-identified patent, spacing of $P^+$ regions disposed adjoining the upper portion of the drift region determines when reverse current flow will be interrupted. Specifically, as the $P^+$ regions are disposed closer to each other, depletion regions induced in the drift region by the $P^+$ regions merge faster, thereby providing faster interruption of reverse current flow. Under the latter condition, however, the forward resistance of the rectifier increases and results in an undesirable increase in the threshold forward-bias voltage.

OBJECTS OF THE INVENTION

It is therefore an object of the present invention to provide a new and improved power rectifier which overcomes the foregoing disadvantages and shortcomings of known rectifiers.

Another object of the present invention is to provide a power rectifier wherein the resistance to current flow is small when the rectifier is forward-biased and wherein the depletion zones merge at a low reverse-bias voltage.

Still another object of the present invention is to provide a high-speed power switching rectifier having a low threshold forward-bias voltage and a fast switching speed.

SUMMARY OF THE INVENTION

In accordance with the present invention, a power rectifier is provided which includes a first semiconductor $N^+$ substrate layer, and a first electrode is in conductive contact with a first surface of the substrate layer. A second semiconductor $N^-$ layer, referred to herein as the drift region, is disposed adjacent a second surface of the substrate layer. The second layer terminates at a principal surface. A second electrode is in conductive contact with the principal surface, and a plurality of discrete $P^+$ regions is located in the drift region. The $P^+$ regions are successively spaced along the principal surface, and each $P^+$ region induces a depletion region extending into the drift region.

The power rectifier, in accordance with one embodiment of the present invention, further includes a plurality of trenches between the $P^+$ regions. The trenches extend from the principal surface into the drift region and the second electrode conforms to the configuration of each trench. Schottky contact is formed between a portion of the second electrode at the lowest portion of each trench and the drift region.

BRIEF DESCRIPTION OF THE DRAWINGS

These and other objects of the present invention, together with further features and advantages thereof, will become apparent from the following detailed specification when read together with the accompanying drawings, in which:

FIGS. 3A-C illustrates fabrication steps for the rectifier shown in FIGS. 1 and 2;

FIGS. 10A-B are schematic views in cross section of power rectifiers in accordance with other embodiments of the present invention;

FIGS. 11A-D illustrates fabrication steps for the rectifiers shown in FIGS. 10A-B;

FIGS. 13A-B illustrates fabrication steps for the rectifier shown in FIG. 12;

DETAILED DESCRIPTION OF THE INVENTION

Figure 1:
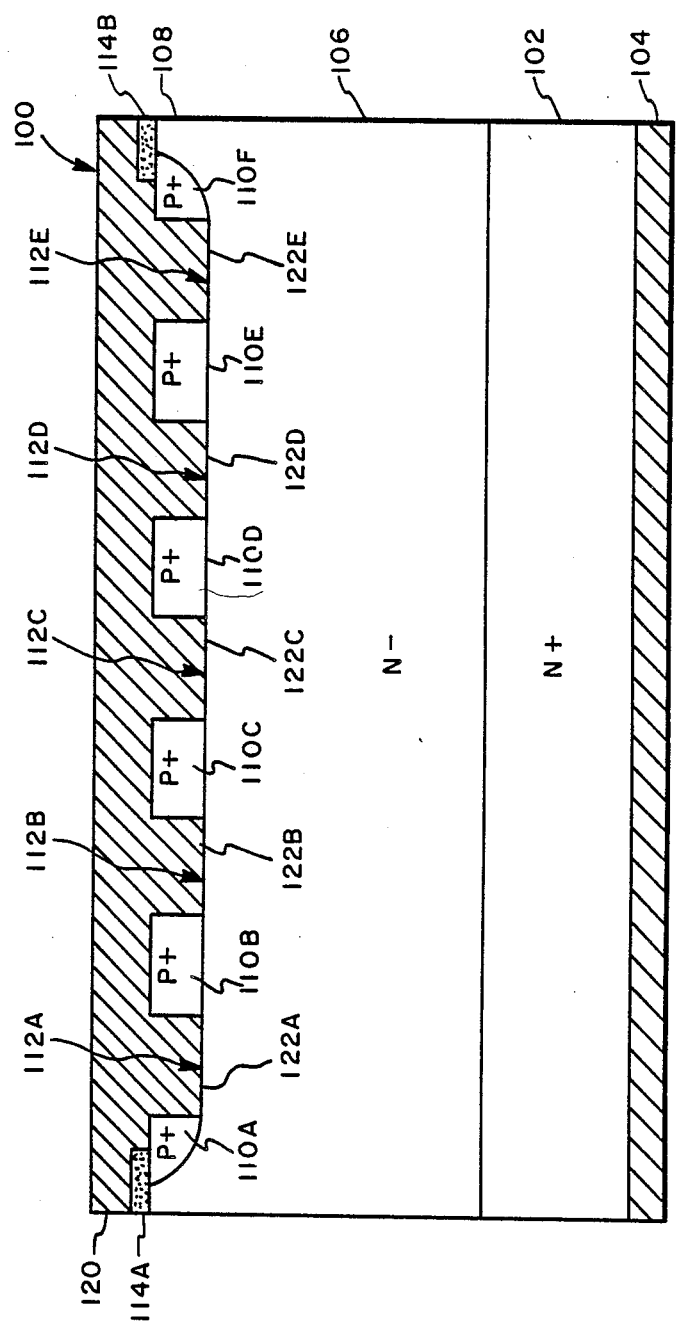
FIG. 1 is a schematic view in cross section of a portion of a power rectifier in accordance with a preferred embodiment of the present invention.

FIG. 1 illustrates a cross section of a power rectifier 100 in accordance with the preferred embodiment of the present invention. Power rectifier 100 includes a first semiconductor substrate layer 102, preferably of silicon, which is highly doped to N-type conductivity. An electrode 104, which is a conductive material such as aluminum, constitutes the cathode of rectifier 100. Electrode 104 forms an ohmic contact with substrate layer 102.

A second semiconductor layer 106, usually formed by an epitaxial process, overlies substrate layer 102 and forms a drift region which terminates at a principal surface 108. Layer 106 is lightly doped to an N-type conductivity. The doping concentration and the thickness of drift region 106 determines the reverse breakdown voltage of rectifier 100 in a manner that will be apparent to those skilled in the art. The thickness of drift region 106 is the distance between principal surface 108 and layer 102.

Power rectifier 100 further includes a plurality of P+ regions 100A-F adjacent drift region 106 and successively spaced along principal surface 108. P+ regions 110 are doped to P-type conductivity and are capable of bringing about current pinch-off when it is desired to interrupt reverse current flow.

Figure 2:
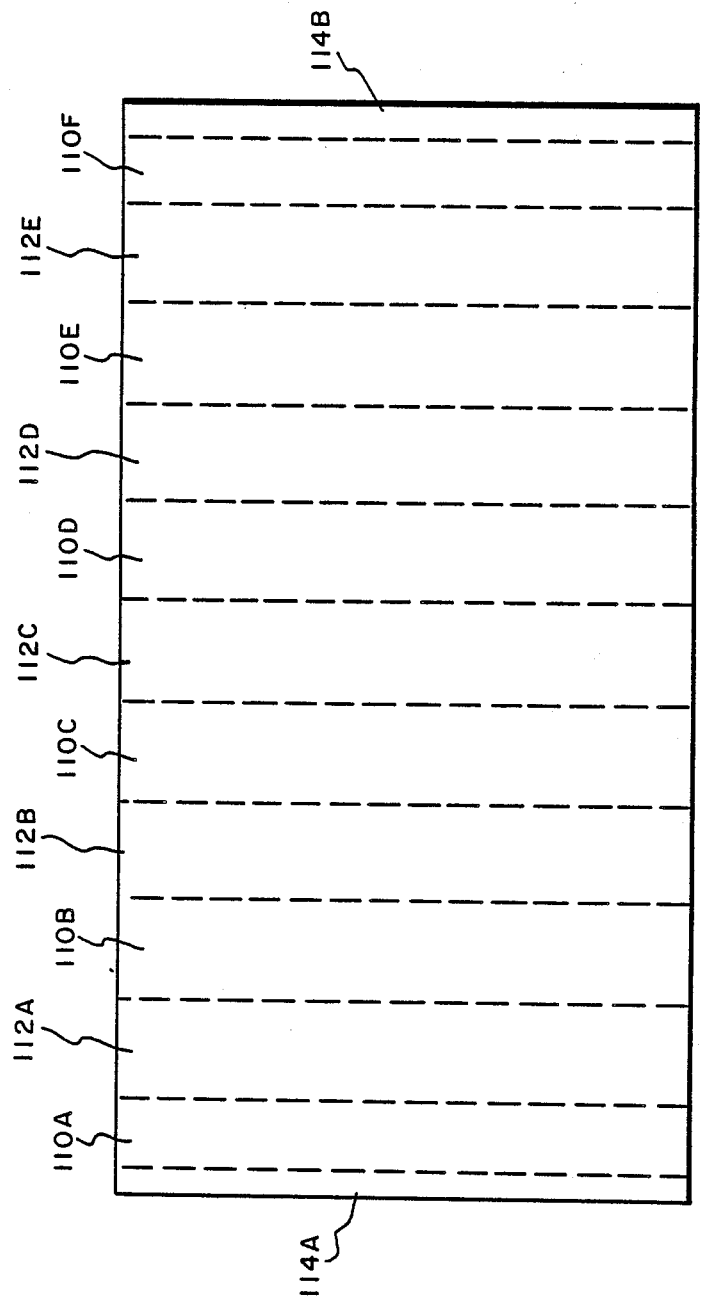
FIG. 2 is a top view of the power rectifier shown in FIG. 1.

A set of parallel, elongate trenches 112A-E is formed in principal surface 108 by etching away, in a well-known manner, sections of epitaxial layer 106 located between P+ regions 110. Although in the illustrated preferred embodiment the trenches and the P+ regions are elongated and parallel to each other, as best shown in FIG. 2, it is contemplated that the P+ regions and the trenches may have many other configurations as hereinafter explained.

Field oxide layers 114A and 114B partially overlie P+ regions 110A and 110F at the edge of the active area of the rectifier. The field oxide layers act as a field plate for termination of the electrical field generated by the device during operation. Overlying and conforming to the configuration of P+ regions 110 and trenches 112 is an electrode 120, such as deposited aluminum, which forms the anode of power rectifier 100. P+ regions 110 have a dopant concentration per cubic centimeter preferably in excess of about $1 \times 10^{18}$ per c.c. The injection efficiency of hole carriers is determined by the P+ region dopant concentration, and anode 120 forms an ohmic contact with the P+ regions. Anode 120 also forms Schottky barrier contact regions 122A-E with drift region 106 at the lowest portion of each trench 112.

Figure 3A:
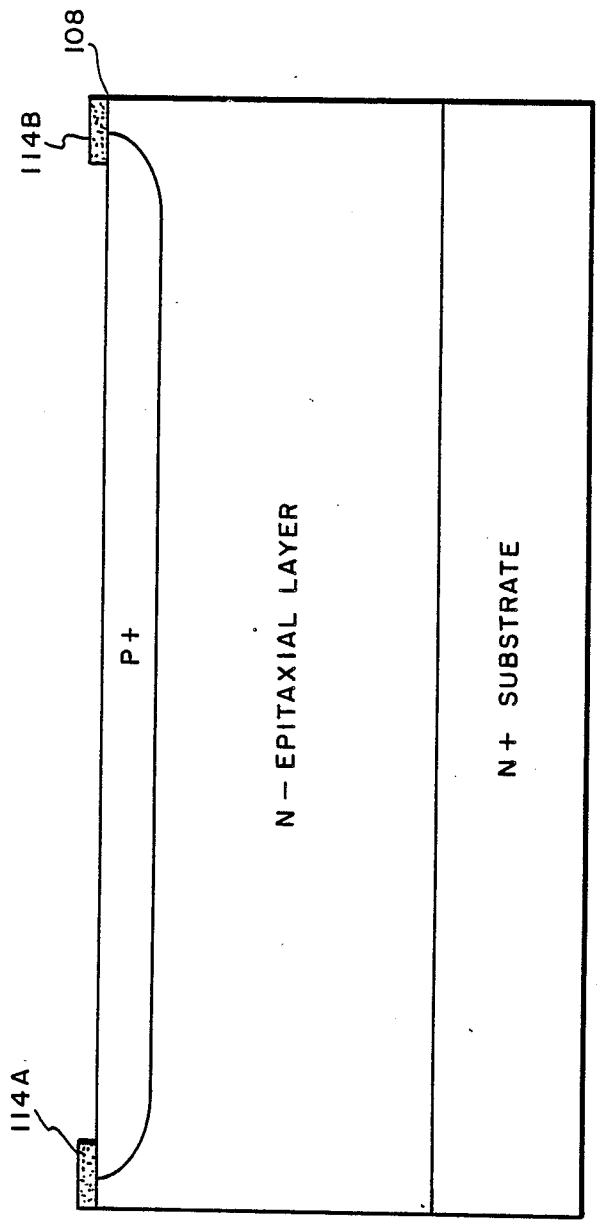
Figure 3C:
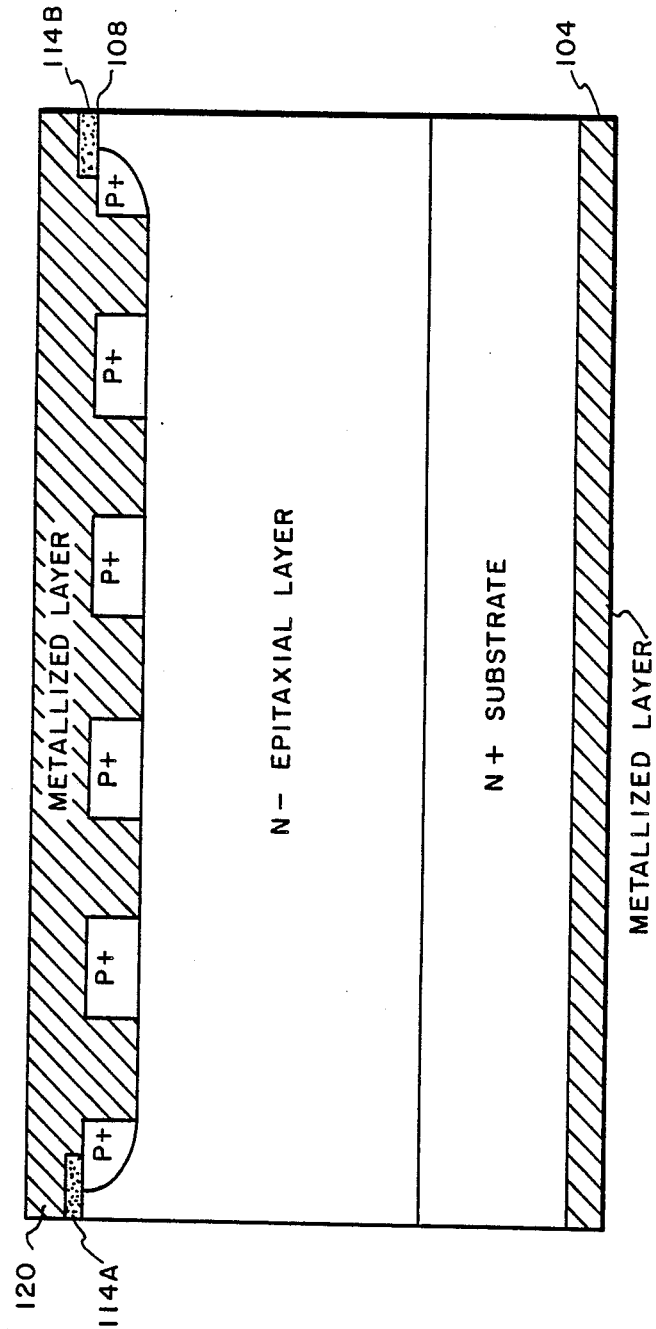

To further facilitate practice of the present invention, a method of fabricating rectifier 100 is briefly explained below with reference to FIGS. 3A-C. Specifically, referring to FIG. 3A, fabrication begins with a lower layer of antimony-doped silicon substrate of N+ conductivity type. Another layer, subsequently formed, comprises a high resistivity, N-type layer epitaxially grown on the substrate. Then a field oxide is grown over the epitaxial layer. The field oxide is then patterned, for example by masking, so that field oxide 114A-B is only present at the edges of the device. Next, a P+ type dopant, such as boron, is diffused into the N-type layer at principal surface 108.

A layer of photoresist is then deposited over the field oxide and principal surface. Masking techniques are then utilized to pattern the resist. Trenches are then etched along the principal surface. The trenches may be formed by well-known etching methods such as reactive ion etching. The photoresist is then dissolved. As shown in FIG. 3B, the trenches preferably are formed to the depth of the P-N junction. The depth of the trenches, however, may vary. For example, if the bottom surface of the trench is above the P-N junction, then a lower reverse leakage current will result because depletion regions induced by the P+ regions are more closely spaced. A higher forward resistance, however, also will result. If the bottom surface of the trench is below the P-N junction, a lower forward resistance will result. A higher reverse leakage current, however, also will result. After the trenches are formed, metallized layers 120 and 104, respectively, are formed at the top and bottom surfaces, respectively, of the device as shown in FIG. 3C. The metallized layers may, for example, be vapor deposited. A more detailed description of the masking and etching processes is included in U.S. Pat. Nos. 4,571,815 and 4,587,712, which are assigned to the present assignee.

Figure 4:
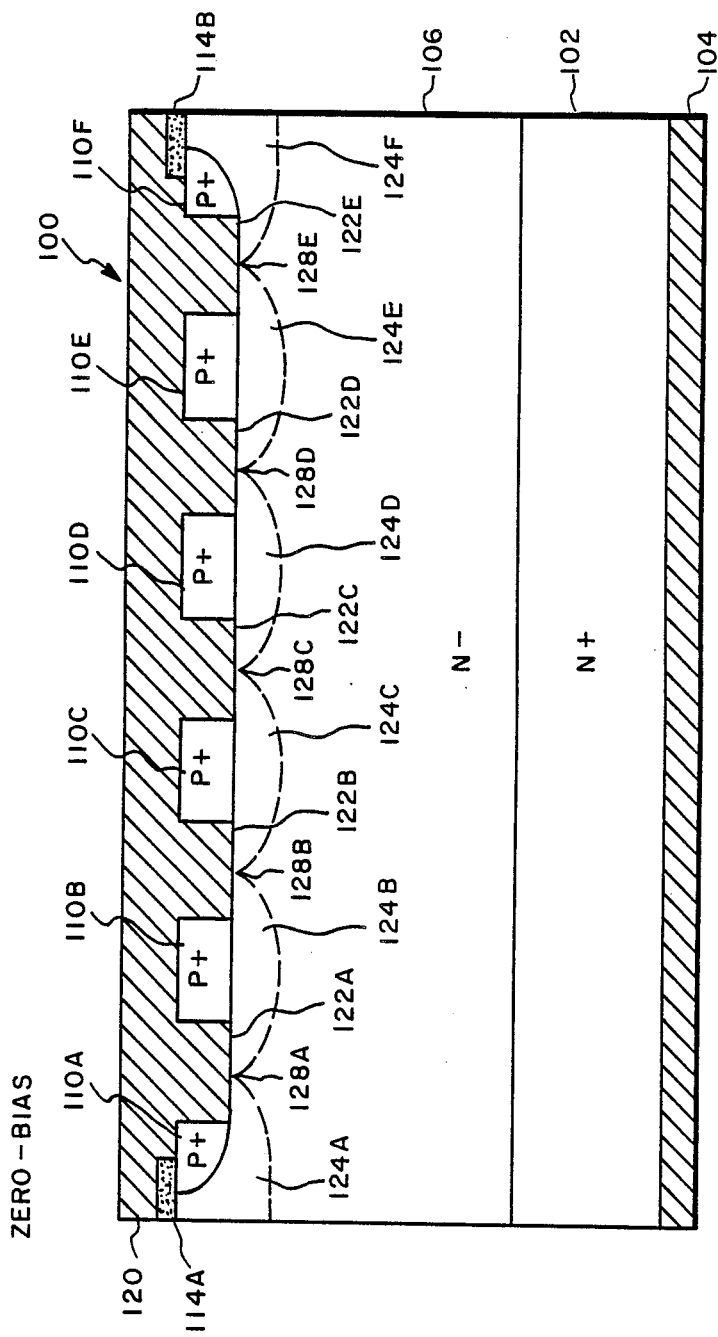
FIGS. 4-6 are views similar to FIG. 1 illustrating the electrical condition of the power rectifier of FIG. 1 under various conditions of device biasing.

FIG. 4 illustrates the electrical condition of power rectifier 100 when anode 120 is electrically shorted to cathode 104. In this condition, generally referred to as the zero-bias condition, P+ regions 110A-F induce depletion regions 124A-F, respectively extending into drift region 106. Depletion regions 124 are created due to the inherent potential difference between the more highly doped P+ regions and the oppositely doped drift region. In this zero-bias condition, adjacent depletion regions 124 merge, as indicated at locations 128A-E between adjacent P+ regions 110. It is not crucial, however, that adjacent depletion regions 124 merge at locations 128A-E. Schottky barrier contact regions 122A-E will prevent an undesirably high level of reverse leakage current when power rectifier 100 is reverse-biased to a degree in which adjacent depletion regions 124 have not yet merged.

Figure 5:
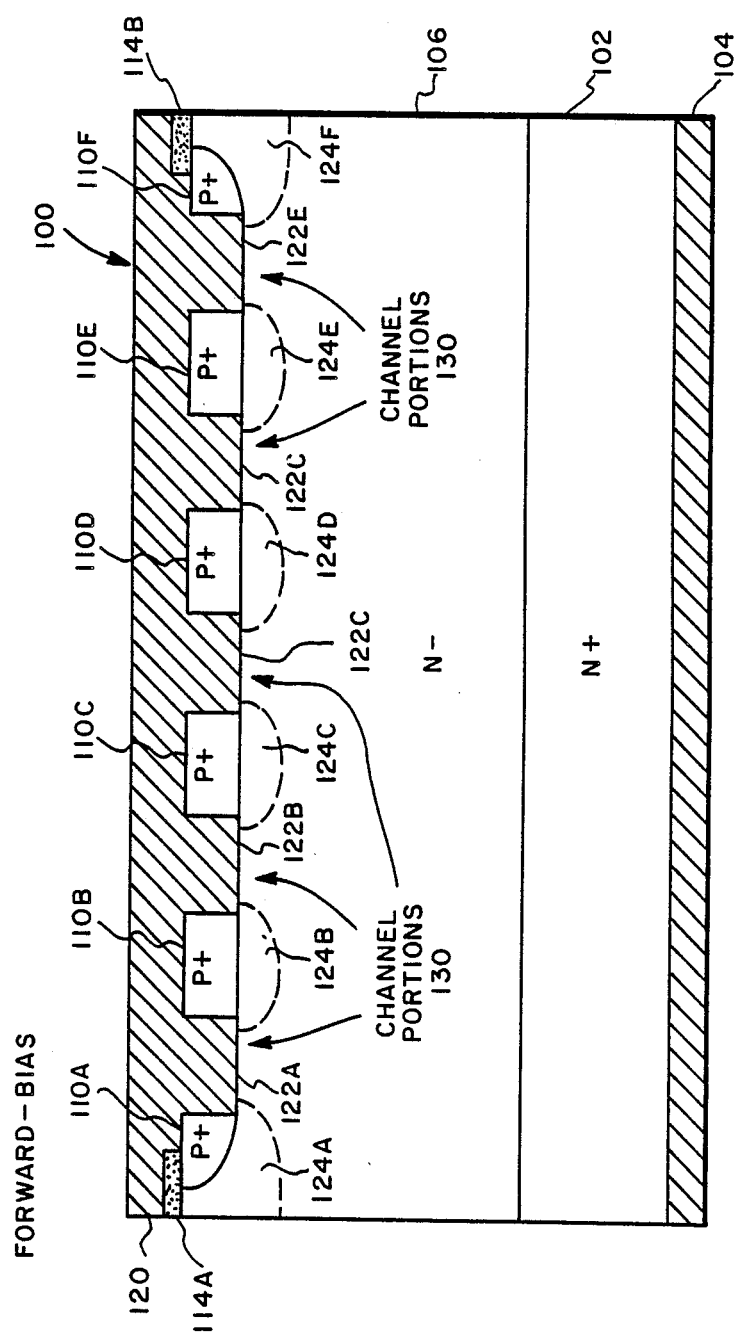

FIG. 5 illustrates the electrical condition of power rectifier 100 upon the application of a forward-bias voltage. In this forward-bias condition, depletion regions 124A-F are smaller than during the previously described zero-bias condition and do not merge. Thus, discrete channel regions 130 are defined between successive depletion regions 124.

For rectifiers constructed in accordance with the present invention and having a breakdown voltage below 100 volts, i.e. uncontrolled current conduction due to avalanche breakdown when reverse-biased at a voltage even below 100 volts, the threshold forward-bias voltage of the rectifier is less than the required forward bias voltage of the P-N junctions. Therefore, current flow is established through Schottky barrier contact regions 122A-E and the P+ regions do not inject any minority carriers into the drift region. Thus, current flows from Schottky regions 122, through the respective conduction channel, and to substrate 102. Because the P+ regions do not inject any minority carriers in low voltage operation, the power rectifier operates at low voltages as a majority carrier device, i.e. a unipolar device.

For rectifiers constructed in accordance with the present invention and having a breakdown voltage of 100 volts or above, the threshold forward-bias voltage of the rectifier is greater than the required forward-bias voltage of the P-N junctions. Therefore, the P+ regions inject minority carriers, i.e. holes, into the drift region. Injecting minority carriers in the drift region reduces the forward resistance of the device in a well known manner. For high voltage applications, the drift region of the present device should be constructed to have a greater thickness than in the low voltage range in order to support the high breakdown voltage.

Figure 6:
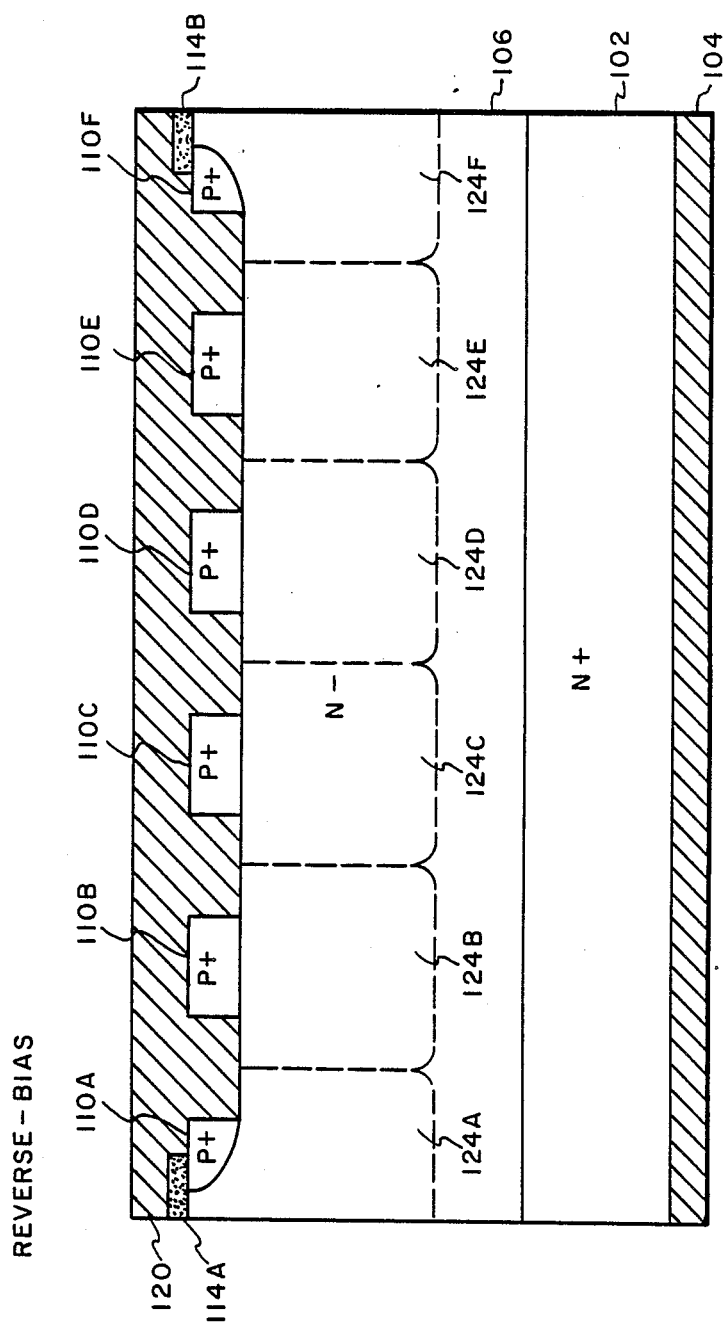

FIG. 6 illustrates the operation of rectifier 100 when it is reverse-biased, i.e. with anode 120 biased at a negative voltage with respect to cathode 104. As shown, the adjacent depletion regions 124 are now merged to form a potential barrier to prevent Schottky barrier lowering, i.e. reverse current flow through the Schottky barrier contact regions. This merged condition serves to interrupt reverse current flow in the conduction channels except for an extremely low level of reverse leakage current. The rate at which the depletion zones merge is determined by the spacing of the P+ regions.

In the low voltage range, the present rectifier operates as a majority carrier device thus providing a very fast switching speed. Specifically, because the present device operates as a unipolar rectifier in the low voltage range, current flow is due only to hole or electron flow. Therefore, in the low voltage range, and relative to bipolar devices wherein recombination of holes and electrons must occur before the device switches off, the present device has a fast switching speed making it suitable for high-speed switching applications. Further, reverse leakage current in the present invention in the low voltage range is lower than reverse leakage current in Schottky rectifiers commonly used in low voltage applications because the trench structure allows the P+ regions to be closely spaced. Thus, the corresponding depletion regions of the respective P+ regions merge quickly to prevent Schottky barrier lowering.

In the high voltage range, although the rectifier operates as a bipolar device, the P+ regions inject fewer minority carriers into the drift region than known P-I-N rectifiers commonly used in high voltage applications. Fewer minority carriers are injected into the drift region because a large fraction of the current flow in the present device will be established through the Schottky barrier regions. As is well known, the Schottky barrier regions have a barrier height lower than the built-in potential of the P-N junctions. Since fewer minority carriers are injected into the drift region, less time is required for recombination of holes and electrons relative to the time required for recombination in known P-I-N rectifiers. Therefore, the present device has a faster switching speed than known P-I-N rectifiers utilized in the high voltage range.

The trench structure of the present device also provides that the P+ regions may be more closely spaced so that reverse leakage current is interrupted quickly. Further, the trenches reduce the length of the drift region thereby reducing the forward resistance of the device.

Figure 7:
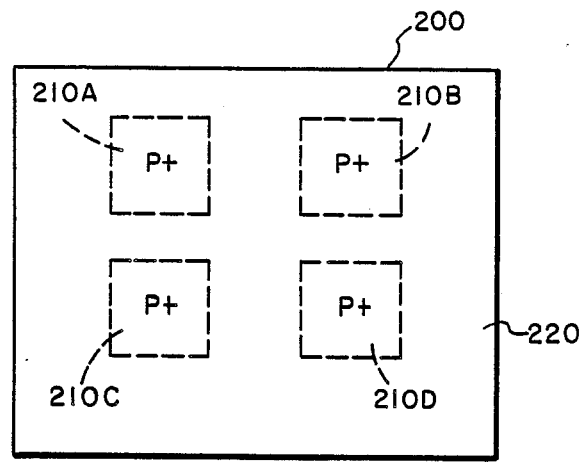
FIGS. 7-9 are top views of alternative structures in accordance with the present invention.
Figure 8:
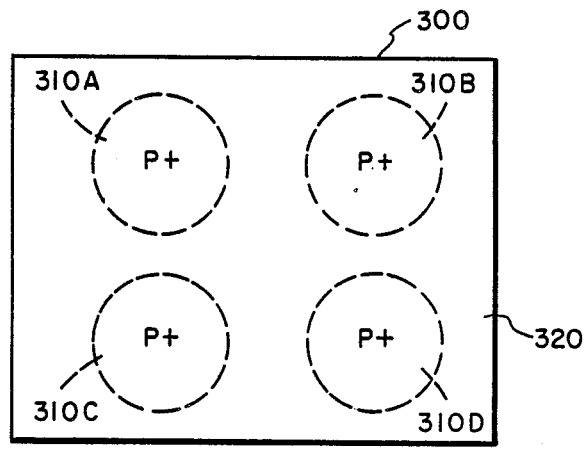
Figure 9:
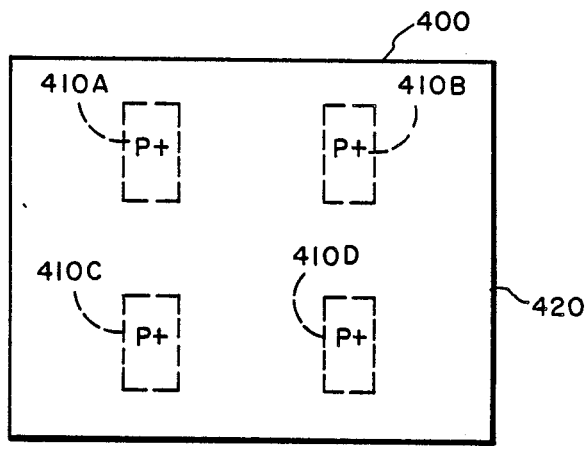

FIGS. 7-9 are top views of alternative structures of rectifiers in accordance with the present invention. Specifically, FIGS. 7-9 are shown to illustrate that the P+ regions may have a square, circular or rectangular cross-sectional shapes respectively. The last two digits of the reference numbers for components shown in FIGS. 7-9 have the same last two digits as the reference numbers for corresponding components, if any, shown in FIG. 1. Further, it should be recognized that the rectifiers described herein could be fabricated with P-type conductivity material interchanged with N-type conductivity material.

Figure 10A:
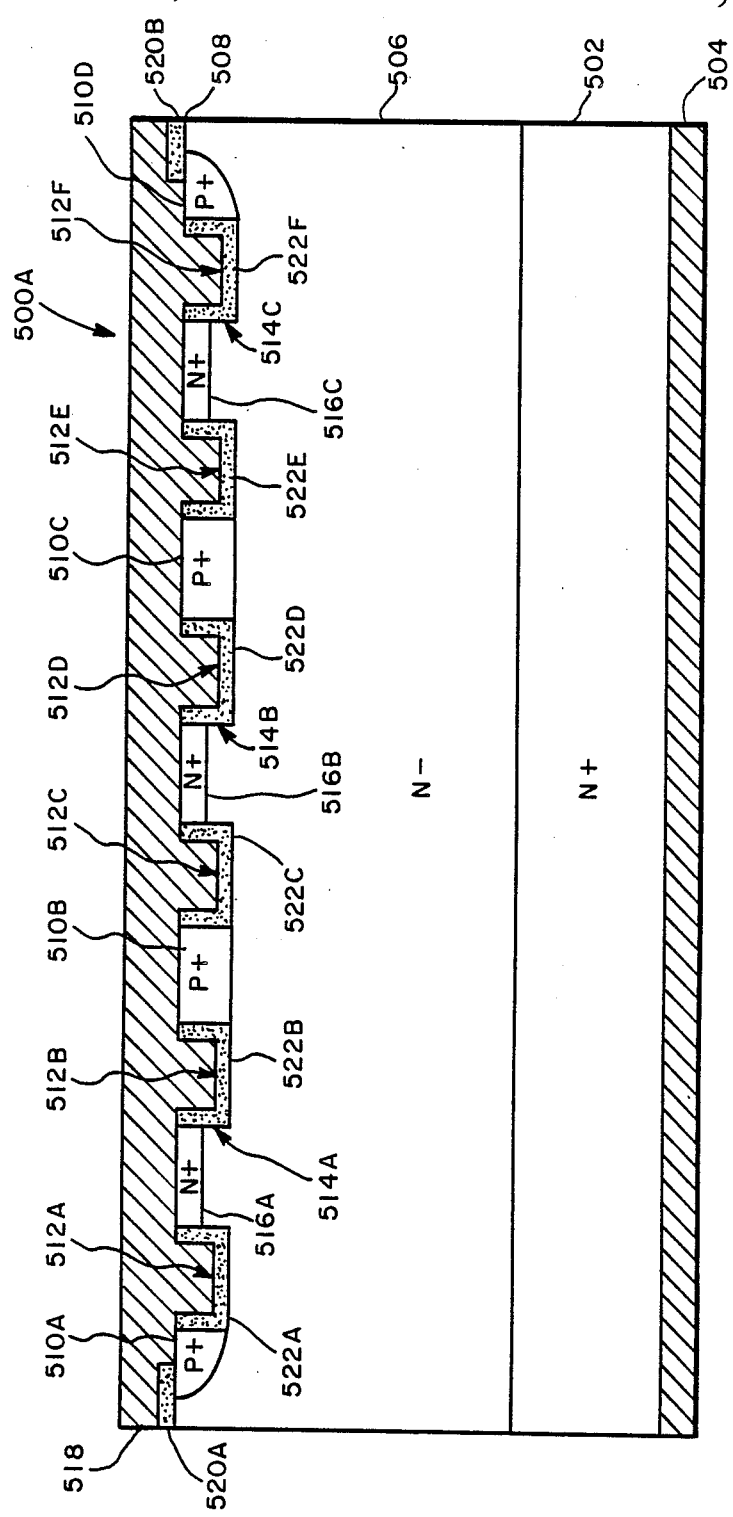

FIGS. 10A-B illustrate other embodiments of the present invention, specifically MOS-gate trench rectifiers. Rectifiers 500A-B shown in FIGS. 10A-B, respectively, include a first semiconductor substrate layer 502 and a cathode 504. A second semiconductor layer 506, referred to as the drift region, overlies substrate layer 502 and terminates at a principal surface 508. P+ regions 510A-D adjacent drift region 506 are successively spaced along principal surface 508. A separate one of mesa regions 514A-C, respectively, is located between each pair of successive spaced P+ regions 510, respectively.

Trenches 512A-F are defined by adjacent mesa region-P+ region pairs. In rectifier 500A, each mesa region includes third layers 516A-C of semiconductor substrate generally highly doped to an N conductivity type. Third layers 516A-C are disposed below the principal surface 508. The third layers and the P+ regions are in ohmic contact with a metallic anode 518. In rectifier 500B shown in FIG. 10B, a separate one of Schottky barrier regions 550A-C, rather than any of the third layers shown in FIG. 10A, is formed at each respective mesa, establishing Schottky contact between the anode and the drift region. In both rectifiers, anode 518 overlies and conforms to the configuration of each trench and mesa. Field plates 520A-B, generally an oxide, partially overlie P+ regions 510A and 510F, respectively, to terminate the electrical field generated by the rectifier in operation. Oxide layers 522A-F, e.g. silicon dioxide, are disposed between the anode and the surfaces of each trench 512.

To further facilitate practice of the present invention in accordance with the embodiments illustrated in FIGS. 10A and 10B, a method of fabricating rectifiers 500A-B is briefly described below with reference to FIGS. 11A-D. Specifically, referring to FIG. 11A, fabrication begins with a lower layer of antimony-doped silicon substrate of N+ conductivity type. Another layer, subsequently formed, comprises a high resistivity, N-type layer epitaxially grown on the substrate. Then a field oxide is grown over the epitaxial layer. The field oxide is then patterned, for example by masking, so that the field oxide is only present at the edges of the device. Next, resist is deposited and then patterned on the principal surface. A P-type dopant, such as boron is then diffused into the drift region. The resist then is removed, such as by etching. Then, for the embodiment in FIG. 10A, resist is patterned over the P+ region. N-type dopant, preferably arsenic, is diffused between the P+ regions. The resist is then removed. Then a layer of nitride and a layer of resist are deposited over the principal surface. The nitride and resist then are patterned to define the width of trenches. The trenches then are formed, for example by reactive ion etching. The resist then is removed.

The assembly is then heated to cause the P-type dopant to be thermally driven to the desired depth. Arsenic is the preferred N-type dopant because it has a diffusion co-efficient much smaller than boron and will therefore not diffuse into the drift region to the depth of the P-N junction. The assembly, after completion of this step, is shown in FIG. 11B. Field oxide 520A-B will have some effect on the diffusion of the P+ region at the edge of the device, and the diffusion depth at the edges will not be uniform as shown in FIG. 11B.

Figure 11A:
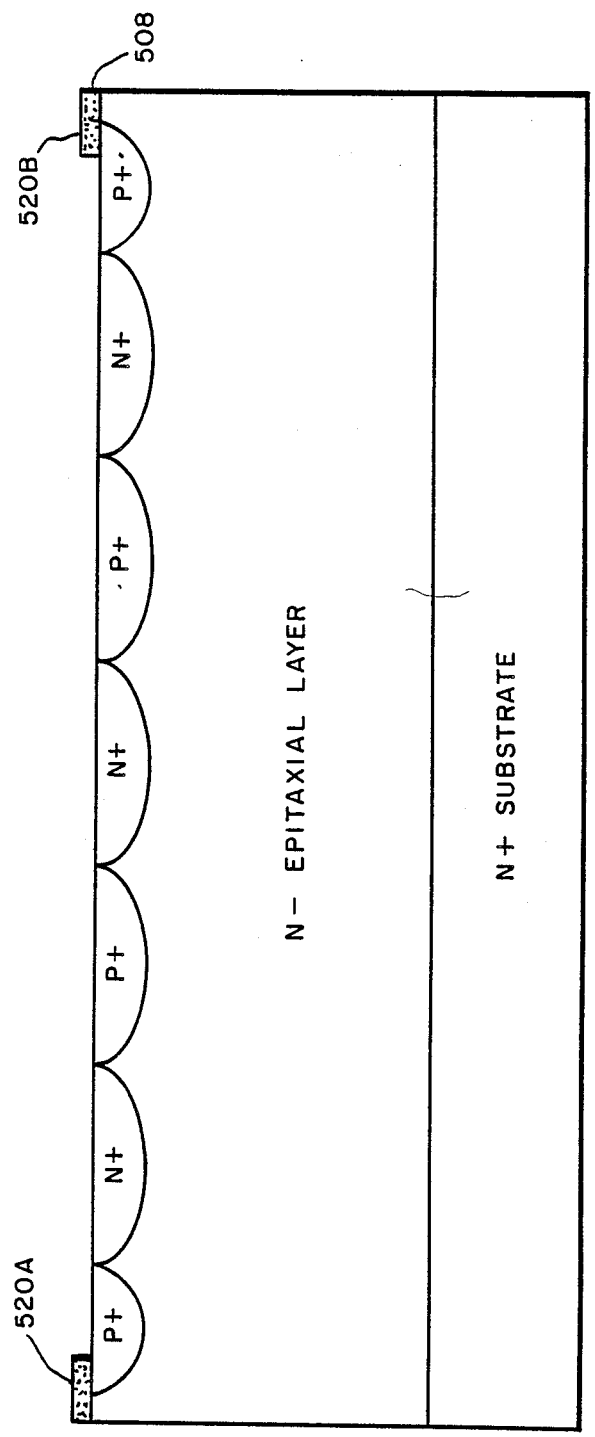
Figure 11C:
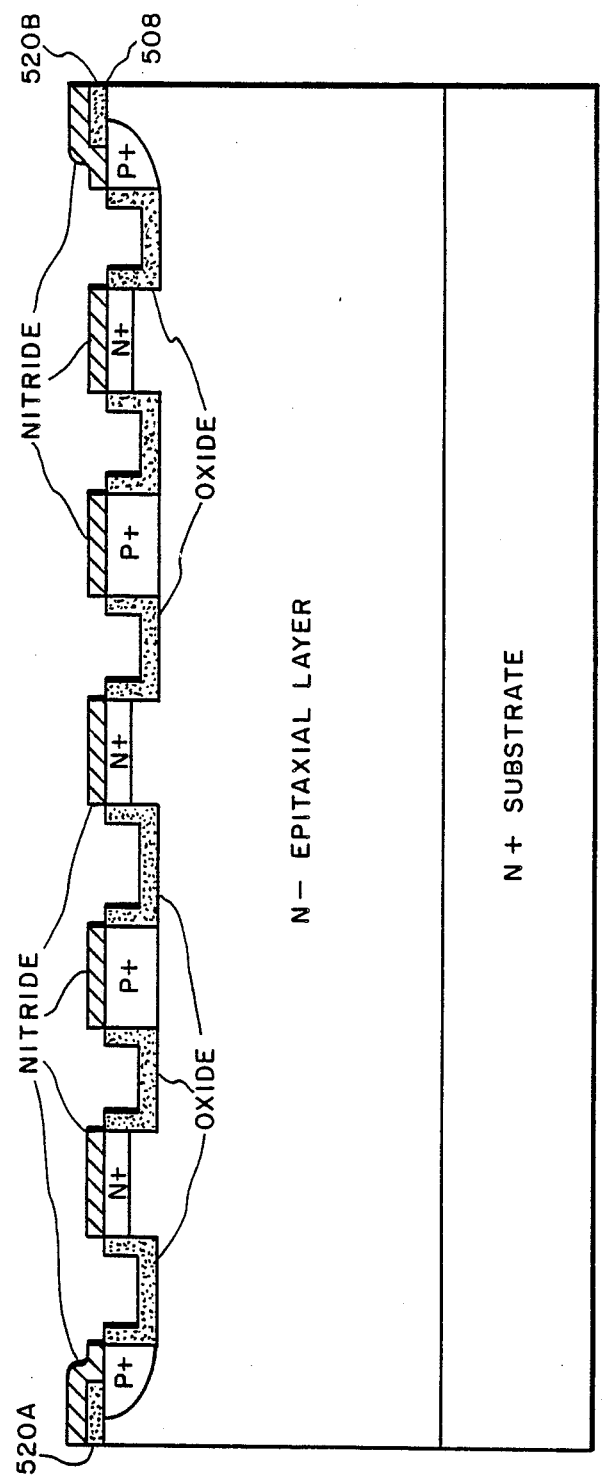
Figure 11D:
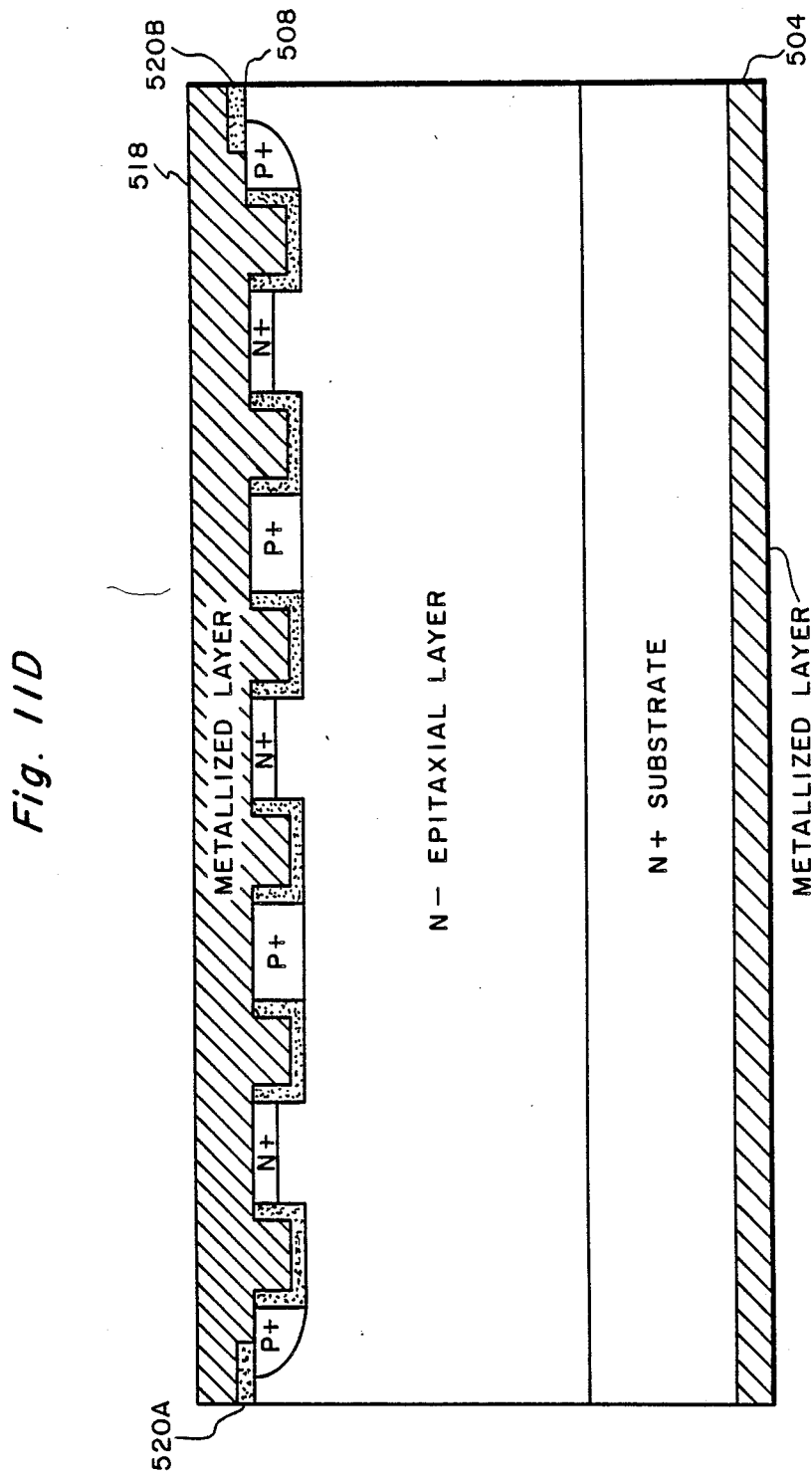

Oxide then is grown as shown in FIG. 11C. The oxide does not grow on the nitride layer, but only on the silicon layers as shown. The nitride layer then is dissolved, and as shown in FIG. 11D, metallized layers 518 and 504, respectively, are formed at the top and bottom surfaces, respectively, of the assembly. The metallized layers may, for example, be vapor deposited.

Rectifier 500A-B operates in substantially the same manner as rectifier 100 illustrated in FIG. 1. In the high voltage range, P+ regions 510 inject minority carriers into drift region 506 during forward conduction. Injecting minority carriers into the drift region decreases the required forward bias voltage of the rectifier.

In the low voltage range, forward conduction occurs in rectifier 500A through the ohmic contact between third layers 516 and anode 518, and in rectifier 500B forward conduction occurs through the Schottky contact formed at Schottky barrier regions 550A-C. In both rectifiers 500A-B, the rectifiers operate as unipolar devices in the low voltage range.

In a reverse-biased condition, with both rectifier 500A and 500B, the oxide layers and the P+ regions induce depletion regions which deplete a portion of the drift region and the mesas in a manner similar to that described in conjunction with FIG. 5. Thus, both the oxide layers and the P+ regions provide potential barrier to reverse leakage current and reduce the reverse leakage current.

Figure 12:
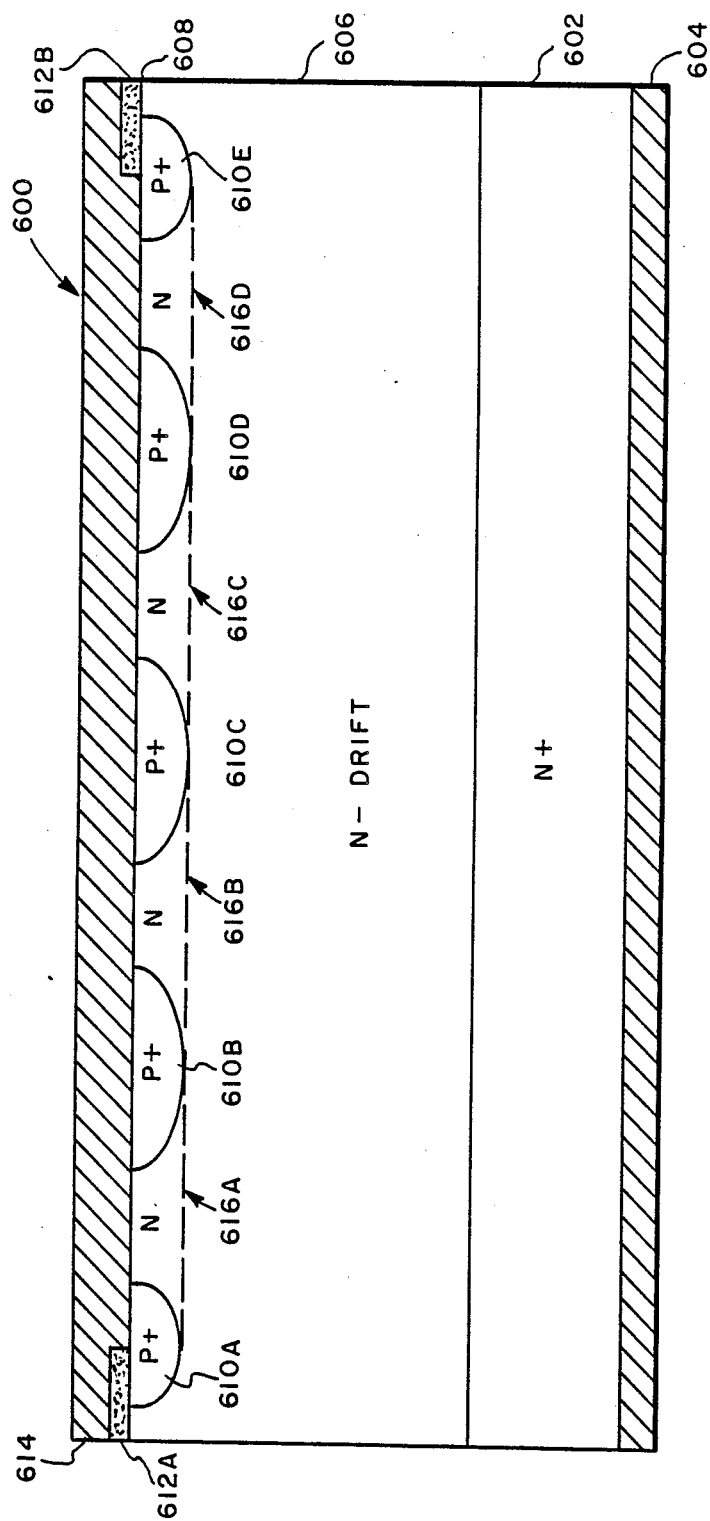
FIG. 12 is a schematic view in cross section of still another embodiment of a rectifier in accordance with the present invention.

FIG. 12 illustrates a further embodiment of a rectifier 600 in accordance with the present invention. Rectifier 600 includes a first semiconductor layer 602 and a cathode 604. A second semiconductor layer 606, the drift region, overlies substrate layer 602 and terminates at a principal surface 608. P+ regions 610A-E are diffused into second layer 606 and successively spaced along principal surface 608. Field oxide layers 612A-B partially overlie P+ regions 610A and 610E at the edge of the active area. A metallic anode 614 overlies the principal surface and forms an ohmic contact with each P+ region and forms a Schottky contact with the drift region.

Rectifier 600 includes N-type dopant implants 616A-D located between successive ones of discrete P+ regions 610A-E. The implants reduce the required forward bias voltage of the device by reducing the pinching effect, i.e. narrowing of the conduction channels, between each pair of adjacent P+ regions. Implants 616A-D may each constitute a thin layer of N-type dopant disposed between the P+ regions. Rectifier 600 may be utilized in both high and low voltage operation, and rectifier 600 operates in a substantially similar manner as rectifier 100 illustrated in FIG. 1.

To further facilitate practice of the present invention in accordance with the embodiment illustrated in FIG. 12, a method of fabricating rectifier 600 is briefly described below with reference to FIGS. 13A-B. Specifically, and referring to FIG. 13A, fabrication begins with a lower layer of antimony-doped silicon substrate of N+ conductivity type. Another layer, subsequently formed, comprises a high resistivity, N-type layer epitaxially grown on the substrate. Then a field oxide is grown over the epitaxial layer. The field oxide is then patterned conventionally, for example by masking, so that the field oxide 612A-B is only present at the edges of the edges of the device. N-type dopant are then implanted into the epitaxially grown layer. Next, following masking, regions of silicon substrate of P+ conductivity type are sequentially diffused, or implanted, into the N-type layer at principal surface 608. Metallized layers are then formed at the top and bottom surfaces, respectively, of the device as shown in FIG. 13B, which represents device 600 of FIG. 12. The metallized layers may, for example, be vapor deposited.

Figure 14A:
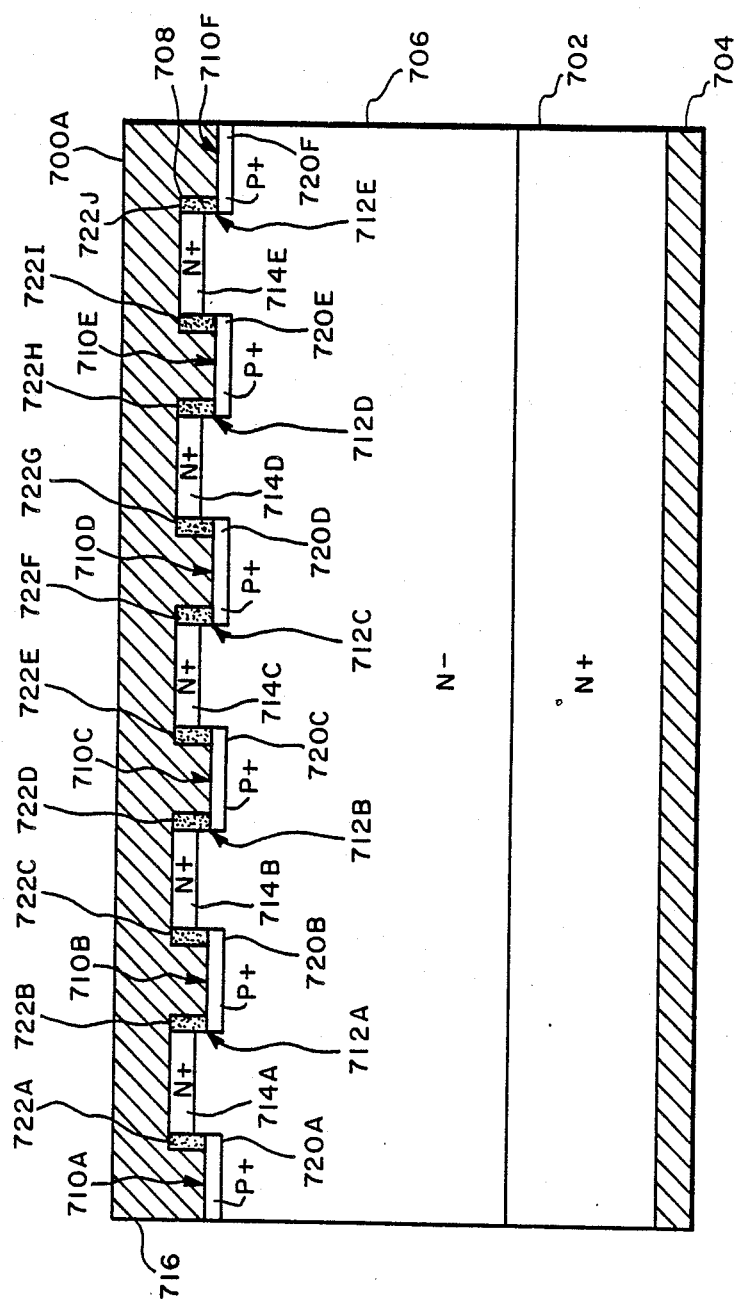
FIGS. 14A-B are schematic views in cross section of still yet other embodiments of a rectifier in accordance with the present invention.
Figure 14B:
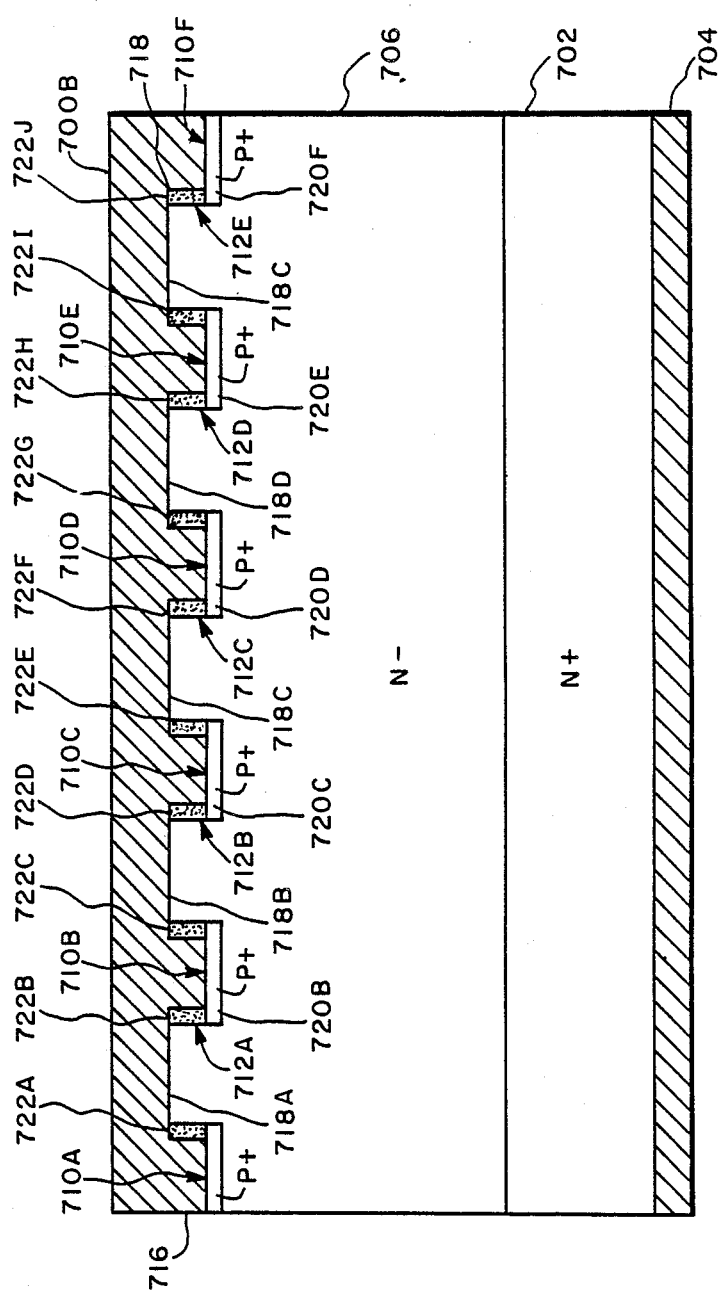

FIGS. 14A-B illustrate still yet other rectifiers 700A-B, respectively, in accordance with the present invention. Rectifiers 700A-B include a first semiconductor substrate layer 702 and a cathode 704. A second semiconductor layer 706 overlies substrate layer 702 and terminates at a principal surface 708. Trenches 710A-F are mutually spaced along principal surface 708 and define mesa regions 712A-E. In rectifier 700A, each mesa region includes third layers 714A-E of semiconductor substrate generally highly doped to a N-type conductivity. Third layers 714 extend from principal surface 708 and are in ohmic contact with metallic anode 716. In rectifier 700B, Schottky barrier regions 718A-E are formed at each mesa at the principal surface and Schottky contact is formed between the anode and drift region. P+ layers 720A-F are disposed in drift region 706 at the bottom surface of each trench. Anode 716 overlies and conforms to the configuration of each trench and mesa. Oxide layers 722A-J, e.g. silicon dioxide, preferably are disposed between the anode and the sidewalls of each trench. These oxide layers, however, are not necessary and may be eliminated.

In the high voltage range, rectifiers 700A and 700B operate as bipolar devices. Specifically, the P+ regions inject minority carriers into the drift region. In the low voltage range, the rectifiers operate as unipolar devices. Specifically, in rectifier 700A, and in the low voltage range, forward current flow occurs through the ohmic contact formed between the anode and third layers 714A-E. In rectifier 700B, and in the low voltage range, forward current flows occurs through the Schottky barrier contact regions. The P+ regions do not inject minority carriers in the low voltage range because the threshold forward-bias voltage of the rectifier is below the required forward-bias voltage of the P-N junctions.

When rectifiers 700A and 700B are reverse biased, depletion regions created by the oxide layers and the P+ layers merge to interrupt reverse current flow. The rectifiers therefore have relatively little reverse leakage current in both low voltage and high voltage operation and a fast switching speed.

To further facilitate practice of the present invention in accordance with the embodiments illustrated in FIGS. 14A and 14B, a method of fabricating rectifiers 700A and 700B is described below with reference to FIGS. 15A–D. Specifically, and referring to FIG. 15A, fabrication begins with a lower layer of antimony-doped silicon substrate of N+ conductivity type. Another layer, subsequently formed, comprises a high resistivity, N-type layer epitaxially grown on the substrate.

Figure 15A:
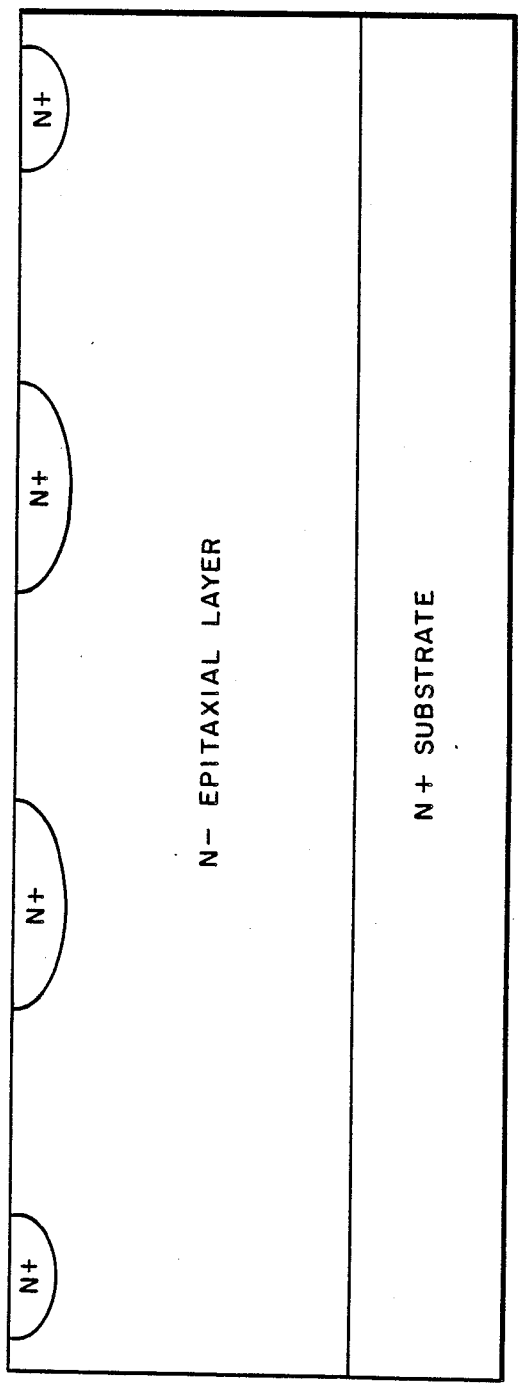
FIGS. 15A-D illustrates fabrication steps for the rectifiers shown in FIGS. 14A-B.
Figure 15B:
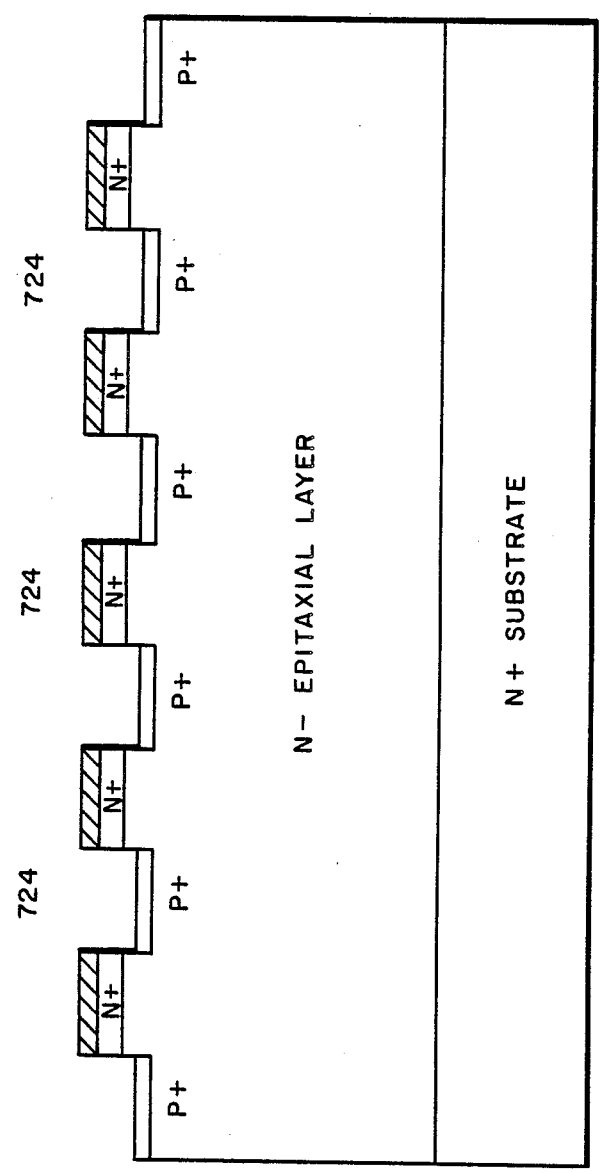

As further shown in FIG. 15A, and for embodiment 700A shown in FIG. 14A, regions of N+ doped silicon, preferably arsenic, are sequentially diffused, following masking, into principal surface 708. The etch resist is deposited along the principal surface and is patterned to define the width of the trenches. The trenches, as shown in FIG. 15B, are then formed via reactive ion etching. The etch resist is then dissolved, and P-type dopants, preferably boron, is diffused into the epitaxial layer at the bottom surface of each trench.

Figure 15C:
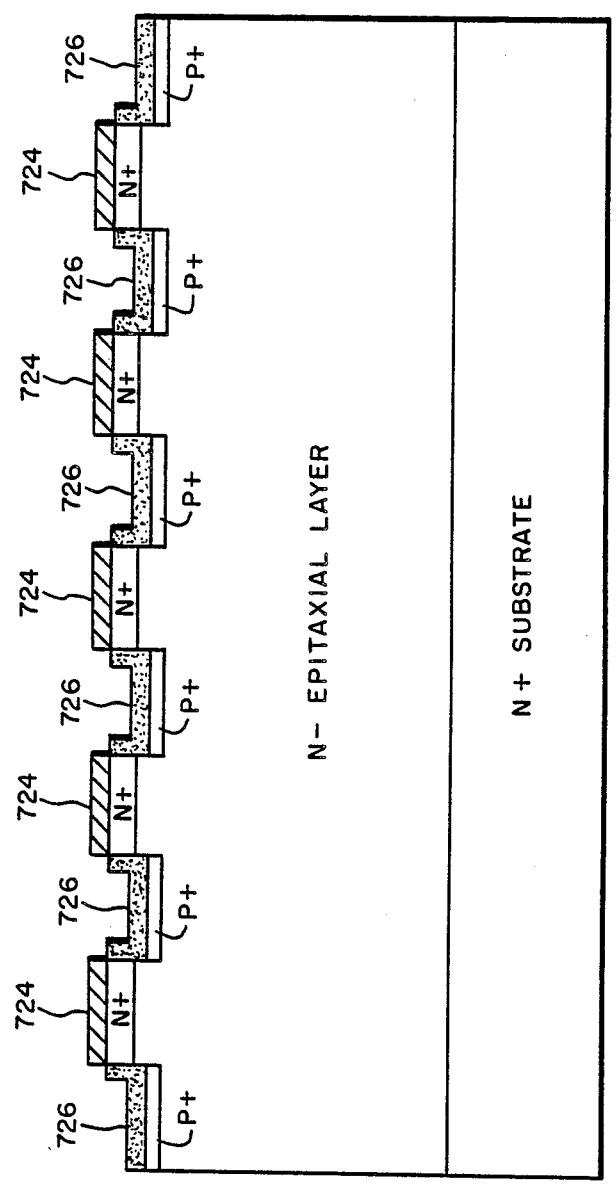

Then, via an etch resist process, a layer of nitride 724 is deposited on the principal surface above each N+ layer as shown in FIG. 15B. As shown in FIG. 15C, a layer of oxide 726 is then grown on the trench structure. As is well-known to those skilled in the art, the oxide will not grow on the nitride layer. Then, via reactive ion etching, the oxide deposited at the bottom surface of each trench is removed. The oxide on the side surfaces is not removed because, as is well-known, reactive ion etching is effective only to remove oxide perpendicular to the vertical travelling ions in the orientation as shown.

Figure 15D:
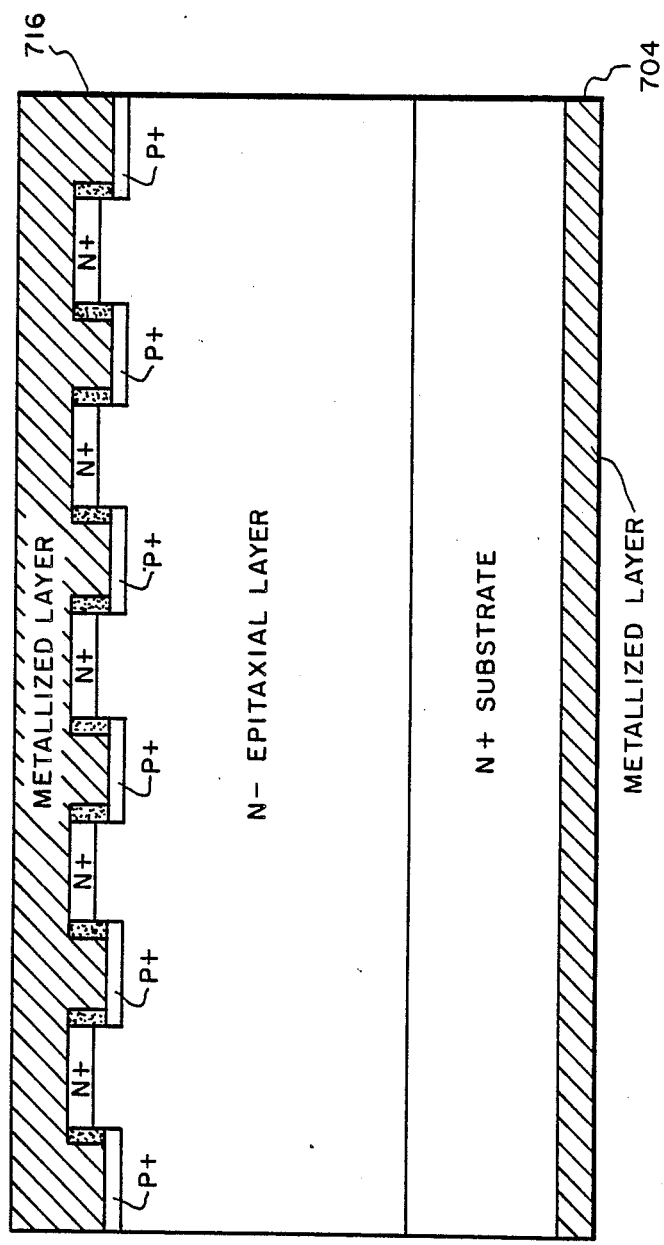

Next, the nitride is removed via wet etching, and as shown in FIG. 15D, metallized layers 716 and 704, respectively, are then formed at the top and bottom surfaces, respectively, resulting in rectifier 700A shown in FIG. 14A. The metallized layer may, for example, be vapor deposited.

The advantages provided by the present invention should be considered in two contexts, specifically in both high and low voltage ranges. In the high voltage range, the devices operate as a bipolar rectifiers. Since fewer minority carriers are injected into the drift region with the present devices as compared to the number of minority carriers injected with known bipolar devices, less time is required for the holes and electrons to recombine in any of the present devices to switch the rectifier off. Therefore, in the high voltage range, the present rectifier provides the advantage of faster switching. Other advantages also are contemplated.

In the low voltage range, because each of the present rectifiers operates as a unipolar device, it provides a much faster switching speed than bipolar rectifiers. Further, the depletion regions induced in the drift region by the P+ regions merge quickly to prevent Schottky barrier lowering. Therefore, in the low voltage range, the rectifiers of the invention provide the advantage of fast reverse current interruption and lower reverse leakage current. Other advantages will also be apparent to those skilled in the art.

While the present invention has been described with respect to specific embodiments, many modifications, variations, substitutions and equivalents will be apparent to workers in the art. For example, the power rectifiers could be fabricated with the P-type conductivity material interchanged with the N-type conductivity material. Further, semiconductor material of the power rectifier could be gallium arsenide or some other semiconductor material. Other modifications will readily suggest themselves to those skilled in the art. Accordingly, it is intended that the invention be limited only by the spirit and scope of the appended claims.

What is claimed is:

1. A rectifier, comprising:
   a first semiconductor layer of a first conductivity type;
   a first electrode in conductive contact with a first surface of said first layer;
   a second semiconductor layer of said first conductivity type having a higher resistivity than said first semiconductor layer and being disposed adjacent a second surface of said first layer opposite said first surface, said second layer terminating at a principal surface;
   a second electrode in conductive contact with said principal surface;
   a plurality of discrete regions in said second layer successively spaced along said principal surface, said regions being effective to induce depletion zones extending into said second layer and capable of interrupting reverse current flow through said rectifier when an appropriate voltage is applied across said first and second electrodes;
   said rectifier having a forward resistance between said electrodes determined by the chosen composition and dimensions of said semiconductor layers, said electrodes, and said regions;
   a plurality of trenches between said regions extending from said principal surface into said second semiconductor layer;
   said second electrode conforming to the configuration of each trench; and
   said second semiconductor layer being doped to form a Schottky contact between a portion of said second electrode at the lowest portion of each trench and said second semiconductor layer.

2. A rectifier in accordance with claim 1 wherein said first semiconductor layer comprises N+ type semiconductor material, and said regions comprise P+ type semiconductor material.

3. A rectifier in accordance with claim 1 wherein the successive spacing of said regions is selected to cause said depletion zones to merge rapidly upon the application to said first and second electrodes of a reverse bias voltage so as to interrupt reverse current flow.

4. A rectifier in accordance with claim 1 wherein said first semiconductor layer comprises N+ type semiconductor material, said second semiconductor layer comprises N-type semiconductor material, and said regions comprise P+ type semiconductor material.

5. A rectifier in accordance with claim 1 wherein said regions and said trenches are elongated and are disposed substantially parallel to each other.

6. A rectifier in accordance with claim 1 wherein one of said trenches is disposed, respectively, between each pair of successive regions, respectively.

7. A rectifier in accordance with claim 6 wherein the successive spacing of said regions is selected to cause said depletion zones to merge rapidly upon the application of a reverse voltage so as to interrupt reverse current flow.

8. A rectifier comprising:
a first semiconductor layer of a first conductivity type;
a first electrode in conductive contact with a first surface of said first layer;
a second semiconductor layer of said first conductivity type having a higher resistivity than said first semiconductor layer and being disposed adjacent a second surface of said first layer opposite said first surface, said second layer terminating at a principal surface;
a second electrode in conductive contact with said principal surface;
a plurality of discrete regions in said second layer successively spaced along said principal surface, said regions being effective to induce depletion zones extending into said second layer and capable of interrupting reverse current flow through said rectifier when an appropriate voltage is applied across said first and second electrodes;
said rectifier having a forward resistance between said electrodes determined by the chosen composition and dimensions of said semiconductor layers, said electrodes, and said regions;
a pair of trenches disposed, respectively, between each pair of successive regions, respectively, the trenches of each of said trench pairs being mutually spaced to define a mesa region therebetween;
said second electrode conforming to the configuration of each trench and mesa region; and
a layer of silicon dioxide disposed between said second electrode and the surfaces of each of said trenches.

9. A rectifier in accordance with claim 8 wherein each of said mesa regions includes a third semiconductor layer of said first conductivity type, said third layer extending into said second layer from said principal surface and being in conductive contact with said second electrode; and wherein
said first semiconductor layer comprises N+ type semiconductor material, said second semiconductor layer comprises N-type semiconductor material, said regions comprise P+ type semiconductor material and said third semiconductor layer comprises N+ type semiconductor material.

10. A rectifier in accordance with claim 8 wherein the successive spacing of said regions and said layers of silicon dioxide is selected to cause said depletion zones to merge rapidly upon the application of a reverse voltage across said first and second electrodes so as to interrupt reverse current flow.

11. A two-terminal semiconductor rectifier comprising:
a first semiconductor layer of N+ type semiconductor material;
a first electrode in conductive contact with a first surface of said first layer;
a second semiconductor layer of N-type semiconductor material and having a higher resistivity than said first semiconductor layer, said second layer being disposed adjacent a second surface of said first layer opposite said first surface, said second layer terminating at a principal surface;
a second electrode in conductive contact with said principal surface;
current interruption means successively spaced along said principal surface and being effective to induce depletion zones extending into said second layer capable of interrupting reverse current flow through said rectifier, and
a plurality of implants of N-type semiconductor material, said implants being disposed within said second layer, below said principal surface, and being disposed within said second semiconductor layer to substantially a same depth as said current interruption means.

12. A two-terminal rectifier in accordance with claim 11 wherein said current interruption means comprises regions of P+ type semiconductor material.

13. A two-terminal rectifier comprising:
a first semiconductor layer of N+ type semiconductor material;
a first electrode in conductive contact with a first surface of said first layer;
a second semiconductor layer of N-type semiconductor material and having a higher resistivity than said first semiconductor layer, said second layer being disposed adjacent a second surface of said first layer opposite said first surface, said second layer terminating at a principal surface;
a second electrode in conductive contact with said principal surface;
current interruption means successively spaced along said principal surface and being effective to induce depletion zones extending into said second layer capable of interrupting reverse current flow through said rectifier; and
a separate trench, respectively, between each pair, respectively, of said successively spaced current interruption means;
said second electrode conforming to the configuration of each of said trenches; and
said second semiconductor layer being doped to form a Schottky contact between a portion of said second electrode at the lowest portion of each of said trenches and said second semiconductor layer.

14. A power rectifier comprising:
a first semiconductor layer of N+ type semiconductor material;
a first electrode in conductive contact with a first surface of said first layer;
a second semiconductor layer of N-type semiconductor material and having a higher resistivity than said first semiconductor layer, said second layer being disposed adjacent a second surface of said first layer opposite said first surface, said second layer terminating at a principal surface;
a plurality of trenches in said second layer successively spaced along said principal surface to define mesa regions therebetween;
a second electrode conforming to the configuration of said trenches and said mesa regions; and
a layer of P+ type semiconductor material disposed between the second electrode and the bottom surface of each of said trenches.

15. A power rectifier in accordance with claim 14 wherein each of said mesa regions includes a third semiconductor layer of said first conductivity type, said third layer extending into said second layer from said principal surface and being in conductive contact with said second electrode; and
the spacing of said layers of P+ material and said oxide layers is selected to cause depletion zones induced in said second semiconductor layer to merge rapidly upon the application of a reverse voltage across said first and second electrodes so as to interrupt reverse current flow.

16. A power rectifier in accordance with claim 14 further comprising:
a layer of oxide disposed between said second electrode and the side surfaces of each of said trenches.

17. A rectifier, comprising:
a first semiconductor layer of a first conductivity type;
a first electrode in conductive contact with a first surface of said first layer;
a second semiconductor layer of said first conductivity type having a higher resistivity than said first semiconductor layer and being disposed adjacent a second surface of said first layer opposite said first surface, said second layer terminating at a principal surface;
a second electrode in conductive contact with said principal surface;
a plurality of discrete regions in said second layer successively spaced along said principal surface, said regions being effective to induce depletion zones extending into said second layer and capable of interrupting reverse current flow through said rectifier when an appropriate voltage is applied across said first and second electrodes;
said rectifier having a forward resistance between said electrodes determined by the chosen composition and dimensions of said semiconductor layers, said electrodes, and said regions; and
a plurality of implants of said first conductivity type, said implants being located in said second layer between successive ones of said regions and being disposed within said second layer to substantially a same depth as said discrete regions.

18. A rectifier in accordance with claim 17 wherein said first semiconductor layer comprises N+ type semiconductor material, said second semiconductor layer comprises N-type semiconductor material, said regions comprise P+ type semiconductor material and said implants comprise N-type semiconductor material.

19. A rectifier in accordance with claim 17 wherein the successive spacing of said regions is selected to cause said depletion zones to merge rapidly upon the application to said first and second electrodes of a reverse bias voltage so as to interrupt reverse current flow.

* * * * *